US005719082A

United States Patent [19]

Violette

[11] Patent Number: 5,719,082

[45] Date of Patent: Feb. 17, 1998

[54] ANGLED IMPLANT TO IMPROVE HIGH CURRENT OPERATION OF BIPOLAR TRANSISTORS

[75] Inventor: Michael Violette, Boise, Id.

[73] Assignee: Micron Technology, Inc., Boise, Id.

[21] Appl. No.: 519,817

[22] Filed: Aug. 25, 1995

[51] Int. Cl.$^6$ .................... H01L 21/331

[52] U.S. Cl. .................... 438/309; 438/370; 148/DIG. 10; 148/DIG. 11

[58] Field of Search .................... 148/DIG. 10, DIG. 11; 438/309, 370

[56] References Cited

U.S. PATENT DOCUMENTS 5,183,768 2/1993 Kameyama et al. .................... 437/31
5,344,787 9/1994 Nagalingam et al. .................... 437/35

FOREIGN PATENT DOCUMENTS 0274621 11/1987 Japan .................... 437/35
0048427 3/1991 Japan .................... 437/35

*Primary Examiner*—Jey Tsai
*Assistant Examiner*—Long Pham
*Attorney, Agent, or Firm*—Schwegman, Lundberg, Woessner & Kluth, P.A.

[57] ABSTRACT

Method and apparatus for improving the high current operation of bipolar transistors while minimizing adverse affects on high frequency response are disclosed. A local implant to increase the doping of the collector at the collector to base interface is achieved by the use of an angled ion implant of collector impurities through the emitter opening. The resulting area of increased collector doping is larger than the emitter opening, which minimizes carrier injection from the emitter to the collector, but is smaller than the area of the base.

8 Claims, 8 Drawing Sheets

ANGLED IMPLANT TO IMPROVE HIGH CURRENT OPERATION OF BIPOLAR TRANSISTORS

FIELD OF THE INVENTION

The present invention relates to semiconductor circuitry and in particular to improving the high current operation of a semiconductor circuit by implanting impurities at an angle to create a local implant with increased area.

BACKGROUND OF THE INVENTION

Semiconductor junctions are often limited in their high current region of operation by leakage currents. In the case of bipolar transistors, as the collector current increases, electron and hole injection increases the base depth into the lightly doped collector region, thus reducing the gain of the transistor. Similar effects are observed in metal oxide semiconductor transistors. One method for improving the high current operation of bipolar transistors include increasing the collector doping concentration throughout its junction with the base via a perpendicular implant of appropriate doping through the base opening as shown in prior art FIG. 1. The peak current at which transistor gain starts to drop off due to high current effects increases, but since the entire collector region vertically adjacent the base is more heavily doped, the base-collector capacitance is significantly increase. Ideally, high current operation should be maximized and base-collector capacitance should be minimized for optimum performance. Similar effects are obtained by increasing the doping of the entire collector region. Since speed is of premium importance in such transistors, there is a need for a solution which does not degrade performance at high frequencies.

A second method shown in prior art FIG. 2 reduces the base-collector capacitance of the first method, which improves the high frequency response, by using a local implant through the emitter to increase the collector doping below the emitter opening only, where the carrier injection into the base mostly occurs at high currents. However, since the highest emitter current density occurs at the emitter edges, scattered carriers bypass the implant around its perimeter, again causing transistor gain loss at high currents. There is a need for both improving the high frequency operation and the high current operation of bipolar transistors without adding many additional processing steps.

SUMMARY OF THE INVENTION

A local collector implant of impurities is created in a bipolar transistor by angling the implant through an emitter opening. The localized implant covers an area larger than the emitter opening, thereby minimizing carrier injection around the perimeter of the implant at high currents. In addition to improved high current operation, high tequency operation is also improved over previous methods of increasing the entire collector doping concentration where it contacts the base or performing a conventional local collector implant through the emitter opening. Only one additional implant is required over normal bipolar transistor formation processes, and no additional masking is required.

In one preferred embodiment, a standard ion beam source using phosphorus as the impurity for a npn transistor is used to perform the angled implant. For a pnp transistor, a p source of impurities is used, such as boron. The impurities are accelerated from the ion source, and a mass spectrometer is used to separate undesired impurities. A high energy, fairly narrow ion beam is focussed and scanned across the emitter opening at an angle to a line perpendicular to the surface of the emitter, resulting in a wider implant at the collector-base junction, which injected carriers have a harder time circumventing. The angling of the beam is accomplished by firing the silicon wafer on which the transistor is being formed with respect to the source of ions.

DESCRIPTION OF THE PREFERRED EMBODIMENT

In the following detailed description of the preferred embodiment, reference is made to the accompanying drawings which form a part hereof; and in which is shown by way of illustration specific preferred embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present inventions. The following detailed description is, therefore, not to be taken in a limiting sense, and the scope of the present inventions is defined only by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 1:
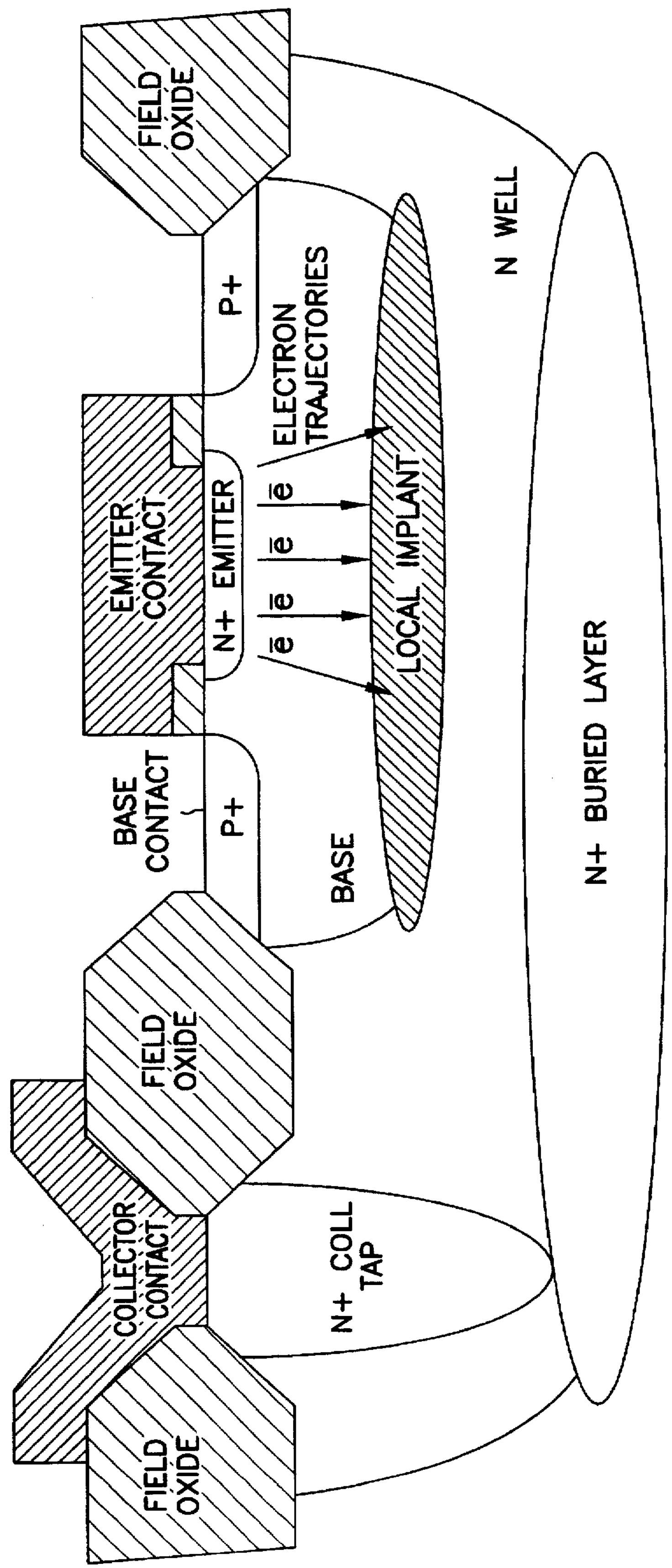
FIG. 1 is a cross section of a prior art semiconductor transistor showing an increased collector doping.
Figure 2:
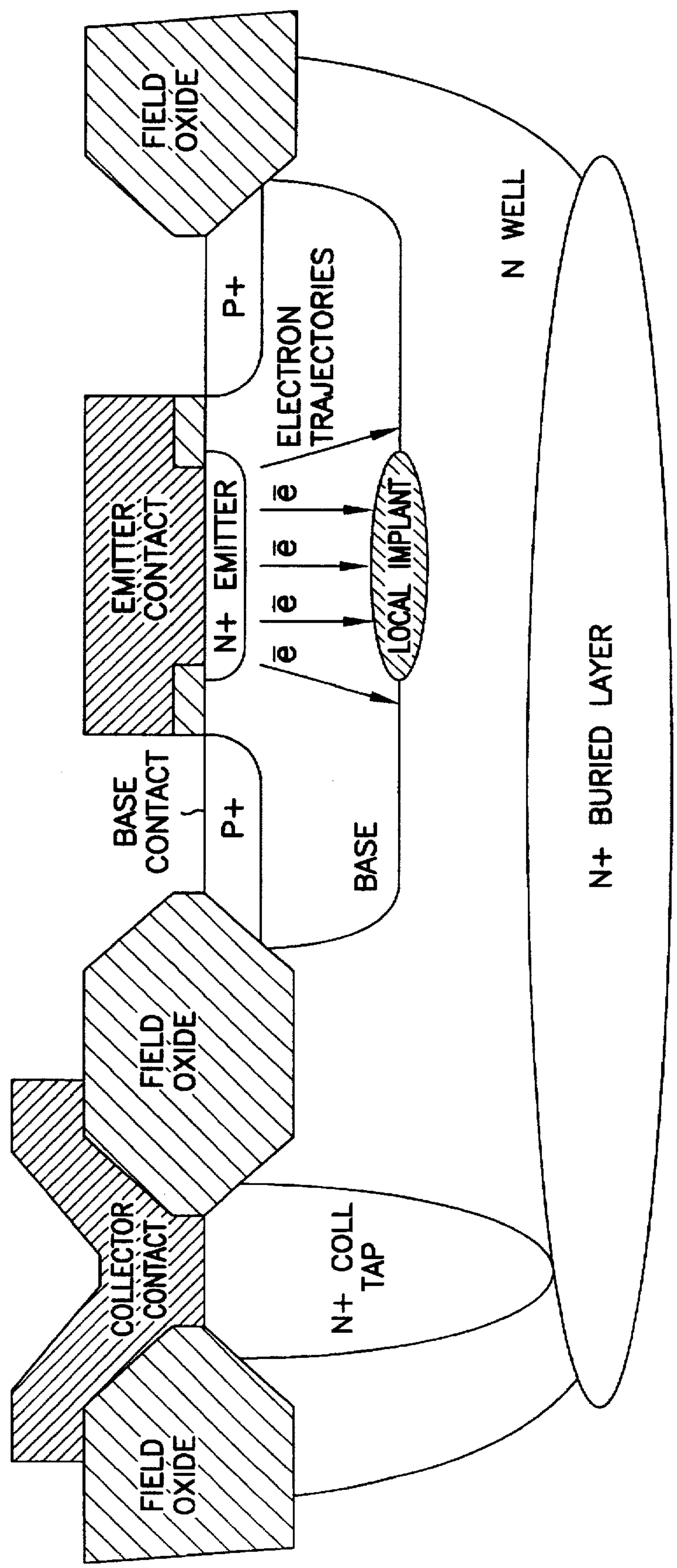
FIG. 2 is a cross section of a further prior art semiconductor transistor showing increased collector doping.
Figure 3:
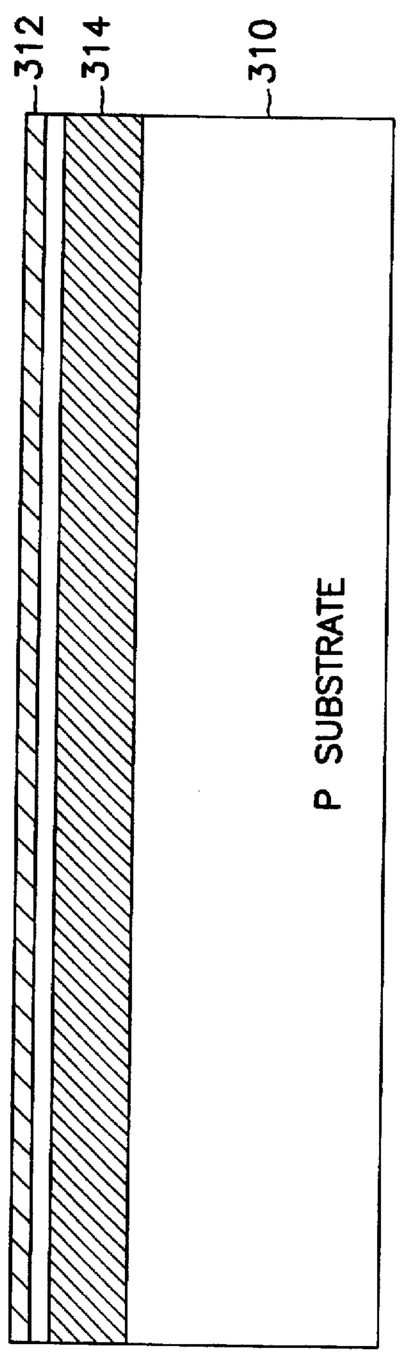
FIGS. 3–13 are cross sections of a semiconductor substrate at various stages, progressing from the initial substrate through the formation of a transistor having a collector implant in accordance with the present invention.

FIGS. 3 through 13 provide an overview of the steps involved in the formation of a typical npn bipolar transistor having an angled collector implant in accordance with the present invention. In FIG. 3, a p-type substrate of silicon 310 has a pad oxide 312 formed on its surface by standard deposition techniques. A p-well 314 is implanted via ion implant. A silicon wafer will have many such substrates contained on it, with circuitry being formed therein through multiple process steps as described below.

Figure 4:
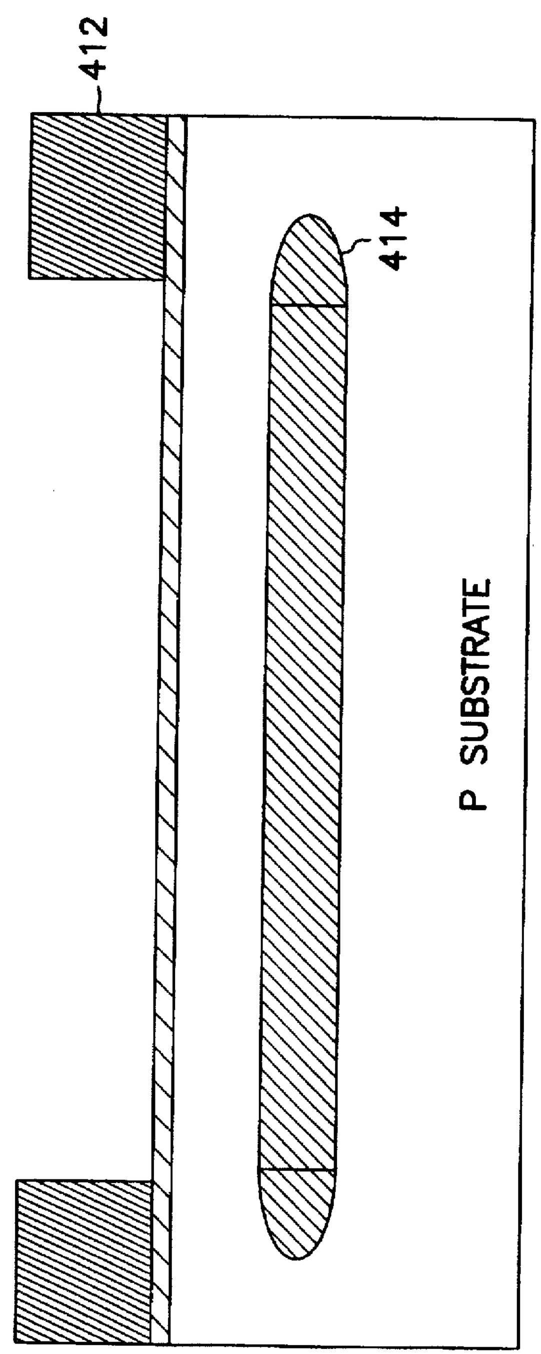
Figure 5:
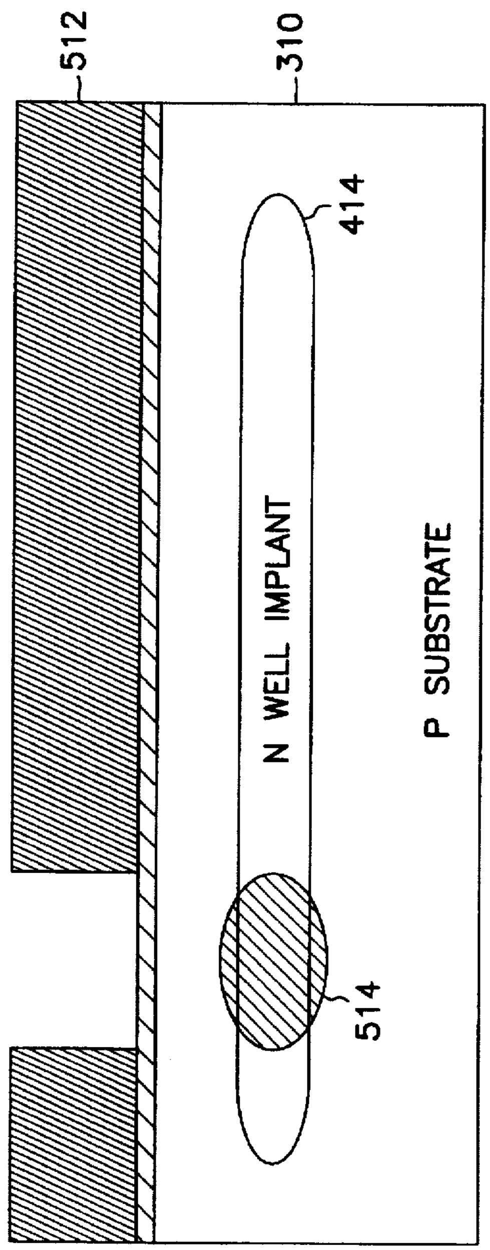
Figure 6:
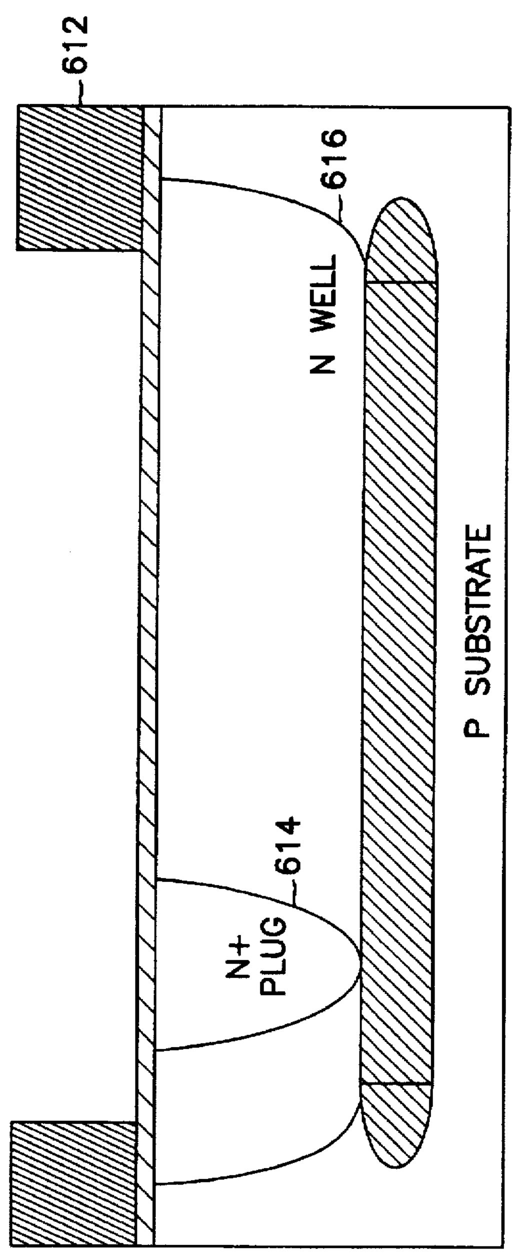

In FIG. 4, a photo resist layer 412 is applied and portions removed to allow the implant of an n-well layer 414 forming the basis for the collector. The remaining photo resist is removed, and, in FIG. 5, a new resist layer 512 is applied and selectively removed to permit the implant of a collector implant tap at 514. In FIG. 6, photo resist 6 12 is applied and selectively removed and a n+ plug 614 and N-well 616 are formed by implantation.

Figure 7:
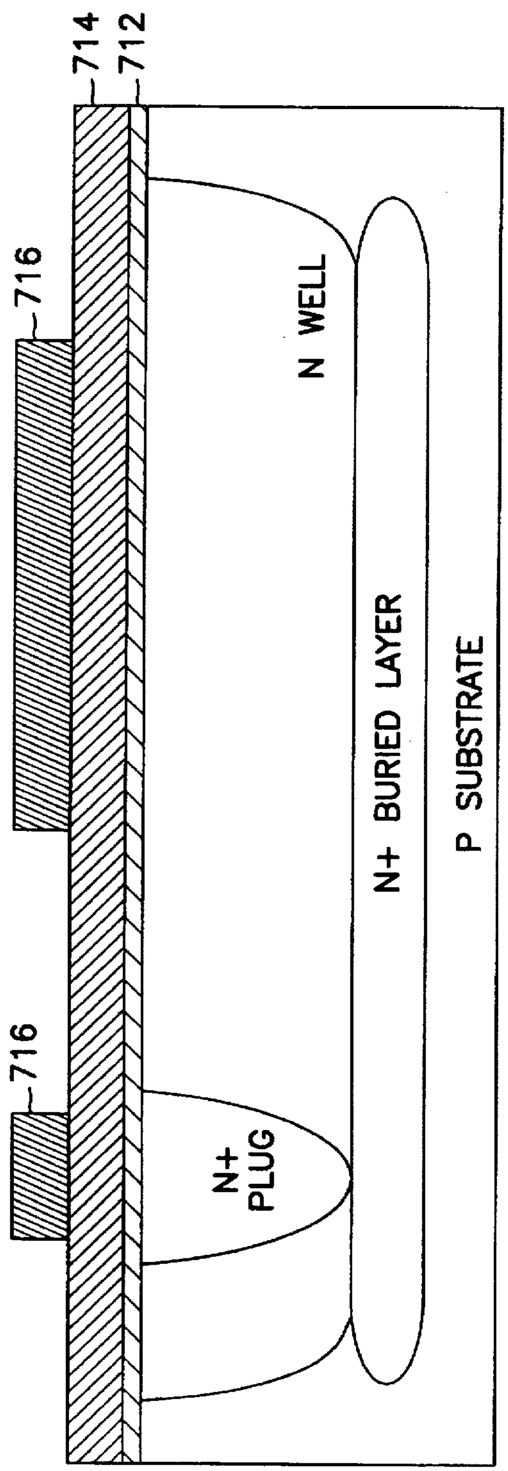
Figure 8:
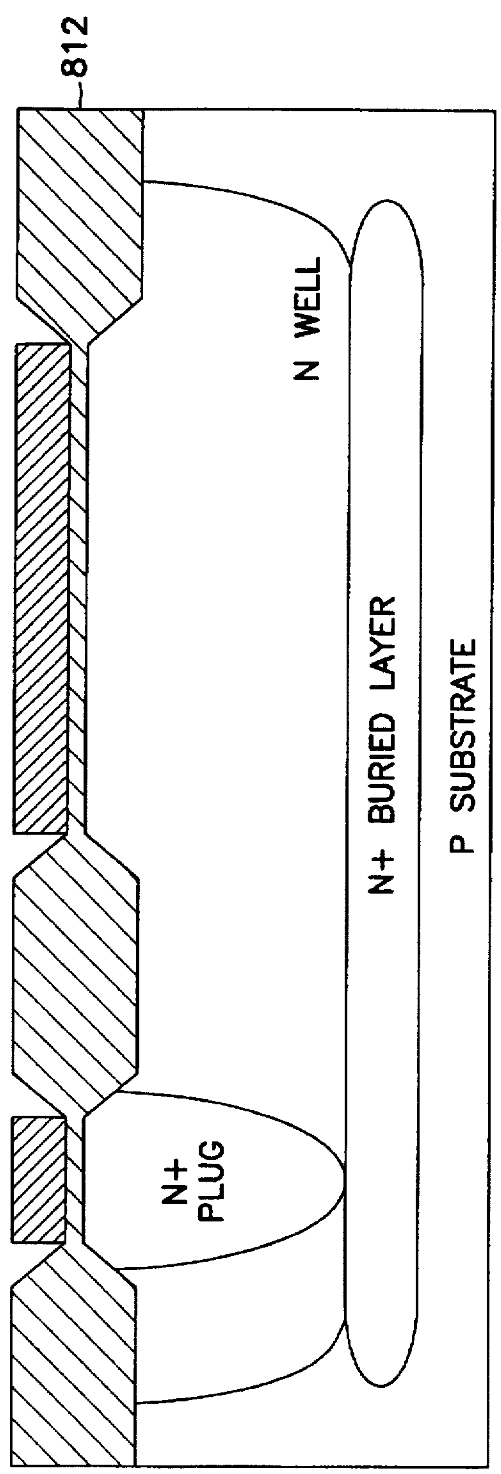
Figure 9:
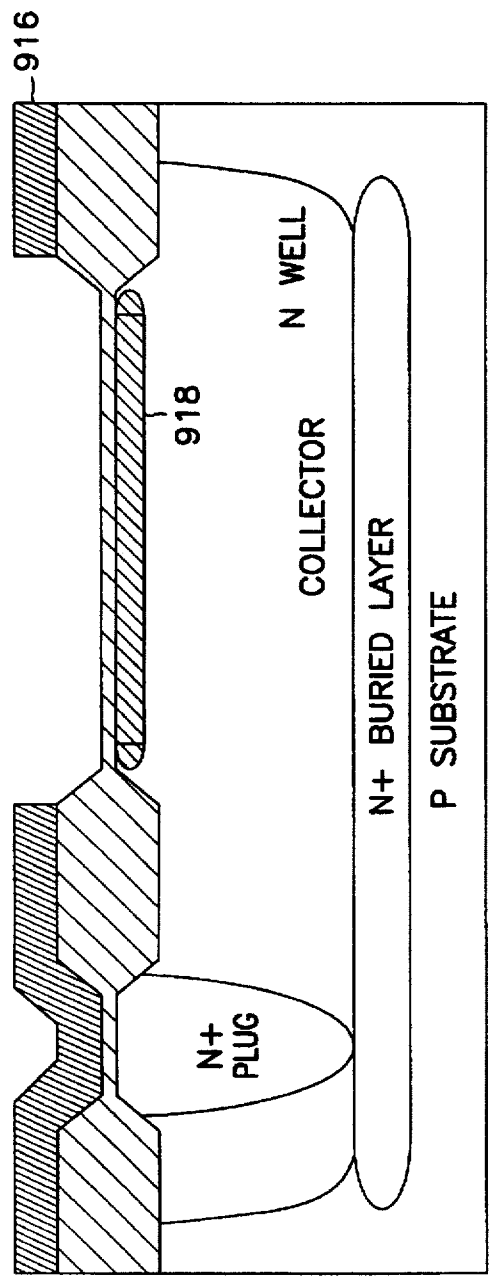

In FIG. 7, a pad oxide 712 and nitfide 714 are deposited and covered by a photo resist 716 which is selectively removed to allow formation of a thick oxide layer where not covered by photo resist 716, and retain covered layers of nitfide 714. The thick oxide layer is formed via field oxidation as indicated at 812 in FIG. 8. Photo resist 716 is then removed. Photo resist is again applied at 916 and a base 918 is implanted through the photo resist in FIG. 9.

Figure 10:
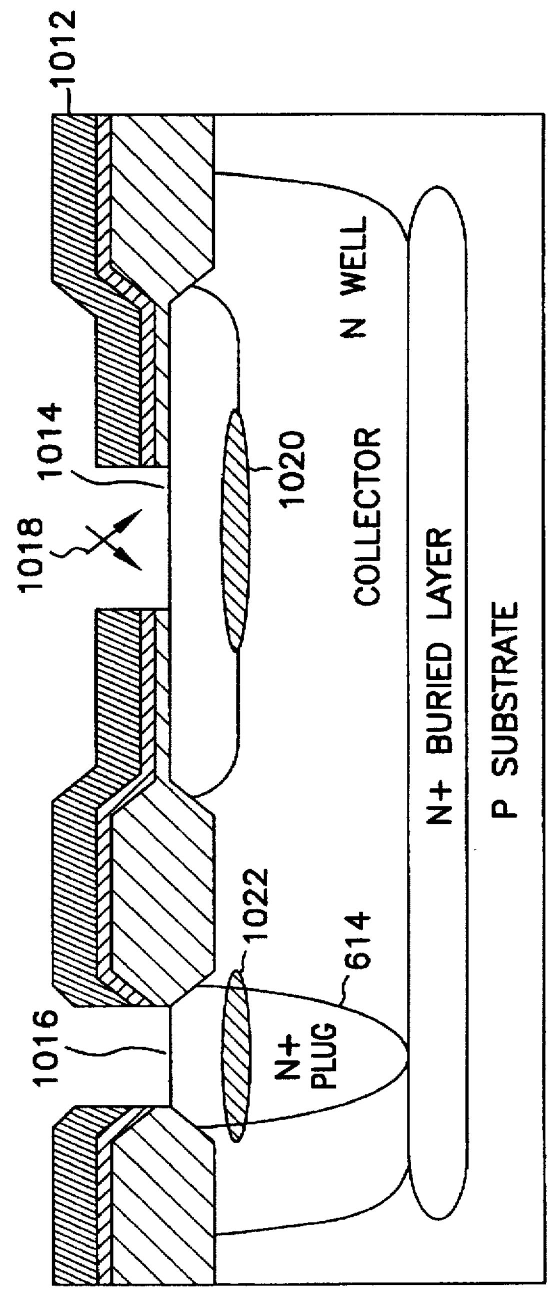

In FIG. 10, another photo resist layer 1012 is applied and selectively removed to expose an emitter opining 1014 and a collector opening 1016. An n-type impurity, such as phosphorous is implanted through such openings via ion implantation to form a collector implant 1020 at the collector-base vertical junction which is wider than the emitter opening 1014 and the eventual emitter. This has the benefit of preventing excess carriers generated at high current from travelling from the emitter to the collector, bypassing the base. Since the n+ collector implant 1020 does not cover the entire surface area of the base where it is vertically adjacent to the collector, the capacitance between the two layers is not greatly increased as in some prior art approaches. When referring to surface areas, it is defined as planes essentially parallel to the top surface of the wafer. The effective surface area of the collector implant is greater than the surface area of the emitter opening, but less than the area of the base which is vertically adjacent said collector.

As opposed to a standard perpendicular implantation, the beam of ions is angled as shown at 1018, with an implantation angle from an imaginary fine which is perpendicular to the surface of the substrate. The impurities are accelerated from the ion source, and a mass spectrometer is used to separate undesired impurities. A high energy, fairly narrow ion beam is focussed and raster scanned across the emitter opening at an implantation angle of about 20 to 30 degrees at the edges of the emitter, redting in a wider implant 1020, which injected carriers have a harder time circumventing. The energy level of the beam will be dependent on the depth required to form the implant at the collector-base junction, and is easily determined by one sldlled in the art. It is typically in the 50 to 150 keV range for most common processes. For a pnp transistor, a p-source of impurities is used, such as boron.

The angling of the beam is accomplished by use of wafer tilting features which are common on many ion implantation devices. The beam itself is usually rastered across the surface of a wafer containing at least one, and likely many thousands of transistors being formed The wafer is continuously tilted and then turned in one embodiment to form the implant. In a further embodiment, the angle is varied to produce reduced doping levels at the edges of the implant to obtain optimal transistor high current operation. The implantation angle is in the range of 20 to 30 degrees from the perpendicular. In other embodiments, actual angles will depend on the desired size and depth of the implant and may vary from greater than zero, to angles that produce implants approaching the size of the base opening. Implantation horizontal surface areas greater than that normally available through the emitter opening using vertical implantation starts to provide the benefits of maintaining appropriate gains at high currents. Once the surface area of the implant approaches the surface area of the base opening, capacitive effects become too great, limiting the high frequency response of the transistor being formed Shadows caused by opposite sides of the emitter opening may limit the angle that can be used, especially for deep collector-base junction implants. This is another case where the angle may be changed during the implant to obtain the total desired area of implantation.

Since the collector tap is also exposed to the ion beam, a second collector implant is formed at 1022 at about the same level of penetration as the increased collector doping under the emitter opening 1014.

Figure 11:
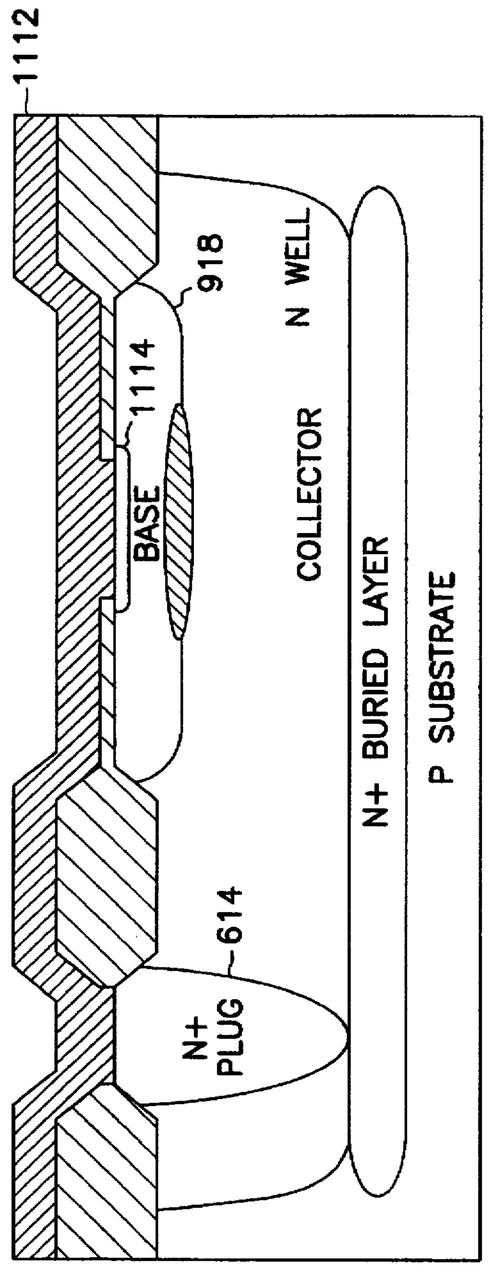
Figure 12:
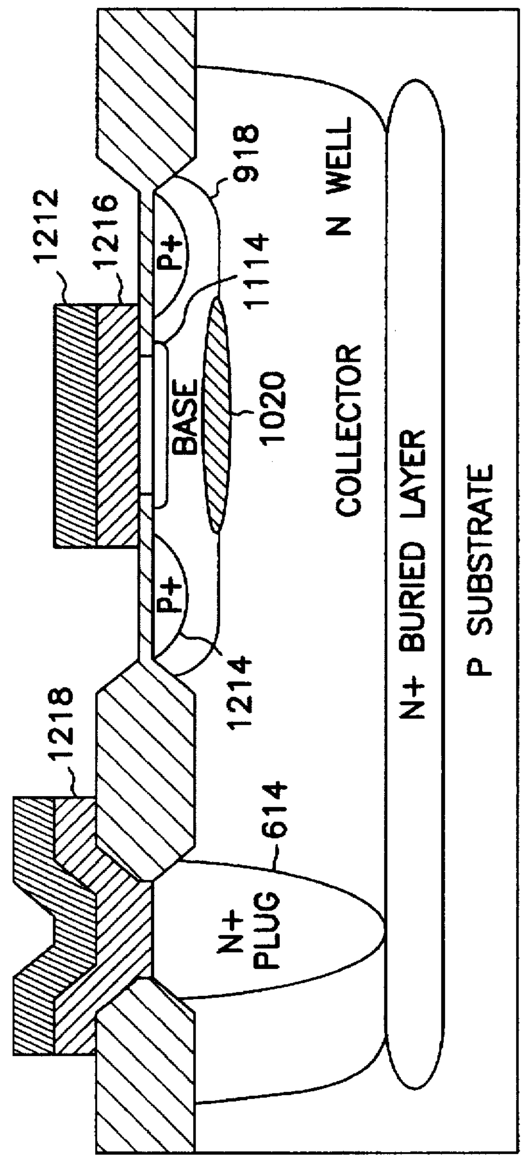
Figure 13:
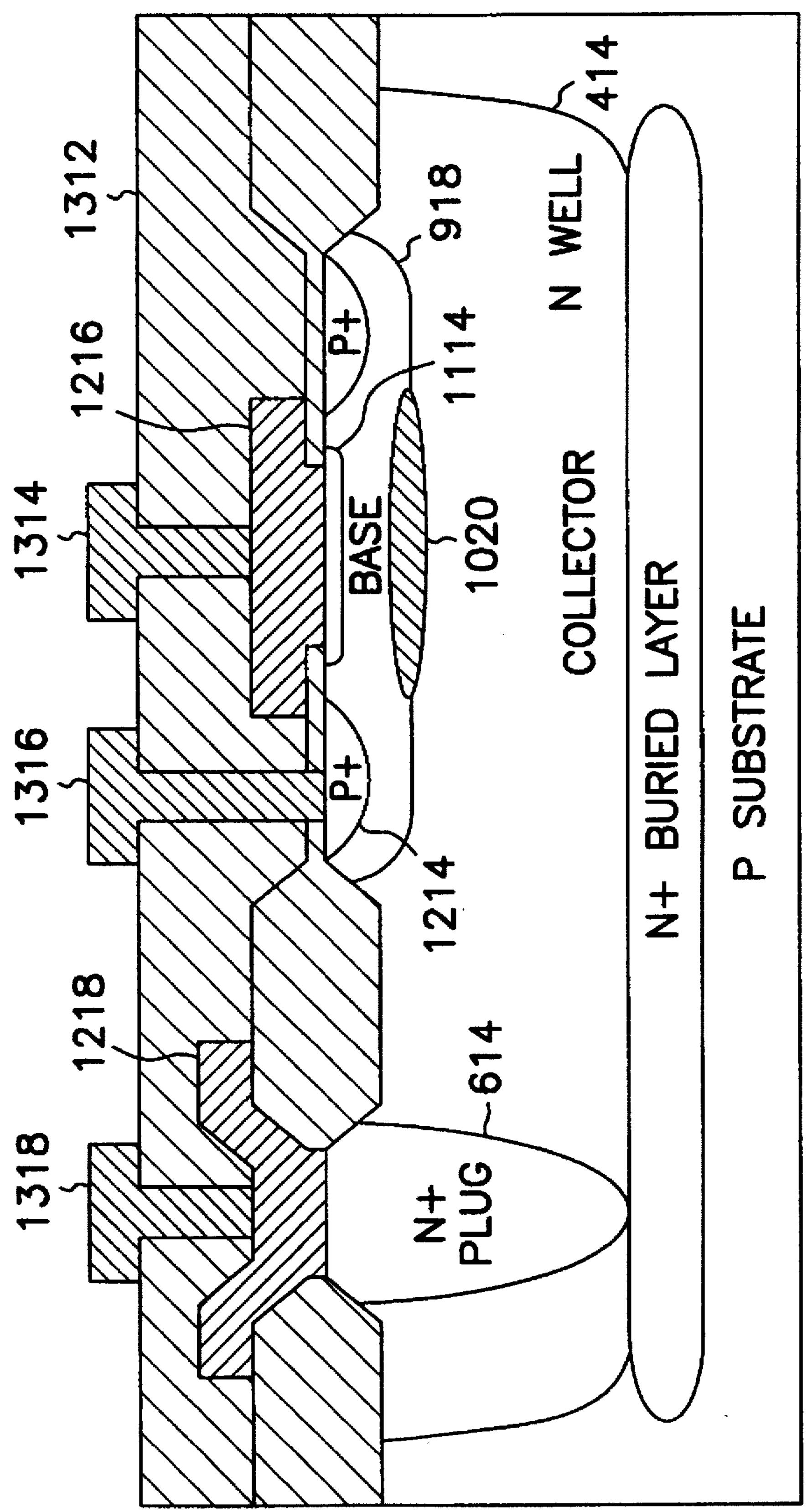

To finish the transistor and form contacts to the active areas, a thick n+ polysilicon layer is applied at 1112 in FIG. 11, and a n+ polysilicon implant 1114 is done to form the emitter. It also provides for a good connection to the collector plug 614. In FIG. 12, photoresist 1212 is applied and selectively removed to allow removal of unwanted areas of n+ polysilicon 1112, leaving a pair of n+ polysilicon electrical contacts comprising n+ contact 12 16 to the emitter 1114 and n+ contact 1218 to the collector plug 614. A p+ implant 1214 provides good contact to the base of the transistor which is now essentially formed. In FIG. 13, final oxide layer 1312 is deposited, and photo resist applied and selectively removed to form a mask for first etching the oxide and then performing a metal deposition of electrical contacts comprising an emitter contact 1314, base contact 1316 and collector contact 1318 which extend through oxide 13 12 to contact the emitter, base and collector.

It is to be understood that the above description is intended to be illustrative, and not restrictive. In many cases, the doping of semiconductor structures may be reversed on a wholesale basis to obtain similar functions. Many other embodiments will be apparent to those of skill in the art upon reviewing the above description. The scope of the invention should, therefore, be determined with reference to the appended claims, along with the full scope of equivalents to which such dims are entitled.

What is claimed is:

1. A method of improving the high current operation of a transistor circuit formed in a semiconductor substrate comprising the steps of:

forming a collector region extending downward from a surface of the substrate by introducing an impurity having a first conductivity type into the substrate having a second conductivity type into the substrate which is generally doped with an impurity which promotes the other type of carrier as a majority carrier;

forming a base region having a surface area, the base region extending downward from the surface of the substrate into a portion of the collector region by introducing an impurity of the first conductivity type into said collector region;

forming an emitter opening on top of said base region, smaller than the surface area of said base;

forming a collector tap opening spaced from the base region;

forming a first area of the collector vertically adjacent said base region having an increased collector doping, and having an effective horizontal area greater than the surface area of the emitter opening, but less than the area of the base which is vertically adjacent said collector: and forming a second area of the collector under the collector tap opening having an increased collector doping and having an effective horizontal area greater than the surface area of the collector tap opening.

2. The method of claim 1 and further comprising the step of:

forming an emitter in the emitter opening by introducing an impurity of the first conductivity type.

3. The method of claim 1 and further comprising the forming of a collector tap from the surface of the substrate spaced from said base region.

4. (Amended) The method of claim 1 wherein said first and second areas of increased collector doping are formed by applying an ion beam to implant appropriate impurities at a depth consistent with the collector to base interface.

5. The method of claim 4 wherein said ion beam is angled with respect to the surface of the substrate such that the area of the implants are greater than the areas of the openings through which they are formed.

6. The method of claim 5 wherein said angle is in the range of 20 to 30 degrees from an imaginary line perpendicular to the surface of the substrate.

7. The method of claim 4 wherein the substrate is titled and turned with respect to the ion beam to obtain the desired angle of implantation.

8. The method of claim 5 wherein the angle of the beam with respect to the surface of the substrate is selected to result in the first area of increased collector doping to be less than the area of the base opening.

* * * * *